(12) United States Patent
Brunner et al.

(10) Patent No.: US 7,872,130 B2
(45) Date of Patent: Jan. 18, 2011

(54) MIXTURE OF OLIGOMERIC PHENAZINIUM COMPOUNDS AND ACID BATH FOR ELECTROLYTICALLY DEPOSITING A COPPER DEPOSIT

(75) Inventors: Heiko Brunner, Mannheim (DE); Wolfgang Dahms, Berlin (DE); Thomas Moritz, Berlin (DE); Akif Özkök, Berlin (DE); Udo Grieser, Berlin (DE); Olanda Grieser, legal representative, Berlin (DE); Christopher Grieser, legal representative, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 1222 days.

(21) Appl. No.: 10/538,286
(22) PCT Filed: Dec. 9, 2003
(86) PCT No.: PCT/EP03/13994
§ 371 (c)(1),
(2), (4) Date: Jul. 5, 2005

(87) PCT Pub. No.: WO2004/057061
PCT Pub. Date: Jul. 8, 2004

(65) Prior Publication Data
US 2006/0226021 A1    Oct. 12, 2006

(30) Foreign Application Priority Data
Dec. 20, 2002 (DE) .............................. 102 618 526

(51) Int. Cl.
*C07D 241/46* (2006.01)
(52) U.S. Cl. .................................................... 544/347
(58) Field of Classification Search ................. 544/347
See application file for complete search history.

(56) References Cited
U.S. PATENT DOCUMENTS
2,707,166 A    4/1955    Brown et al.

(Continued)

FOREIGN PATENT DOCUMENTS
DE    947656    8/1956

(Continued)

OTHER PUBLICATIONS

Dörwald, F. Zaragoza. Side Reactions in Organic Synthesis: A Guide to Successful Synthesis Design, Weinheim: Wiley-VCH Verlag GmbH & Co. KGaA, 2005, Preface.*

(Continued)

*Primary Examiner* — James O Wilson
*Assistant Examiner* — Douglas M Willis
(74) *Attorney, Agent, or Firm* — Frank J. Bonini, Jr.; John F. A. Earley, III; Harding, Earley, Follmer & Frailey, P.C.

(57) ABSTRACT

For the reproducible manufacturing of particularly uniform and brilliant i.e., highly bright copper coatings that are leveled and ductile as well, a copper plating bath is utilized that contains as an additive a mixture of oligomeric phenazinium compounds. The mixture contains at least one phenazinium compound selected from the group comprising compounds containing two monomeric units and compounds containing three monomeric units having the general chemical formulae <I> and <II> set forth in the patent claims and in the specification as well as further oligomeric phenazinium compounds.

<I>

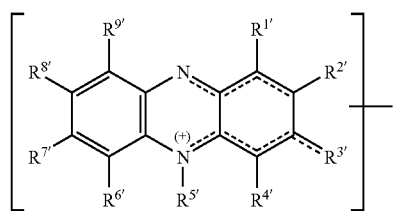

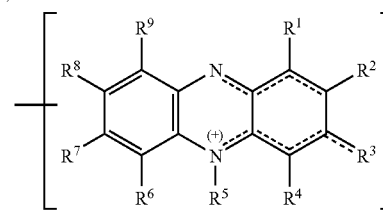

<II>

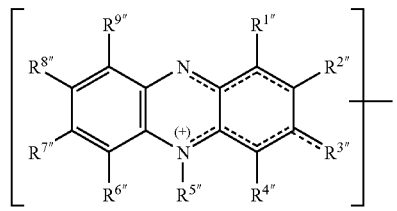

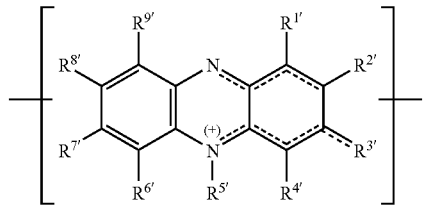

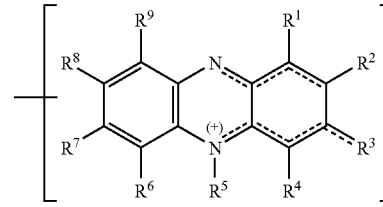

12 Claims, 1 Drawing Sheet

U.S. PATENT DOCUMENTS

Figure 1:
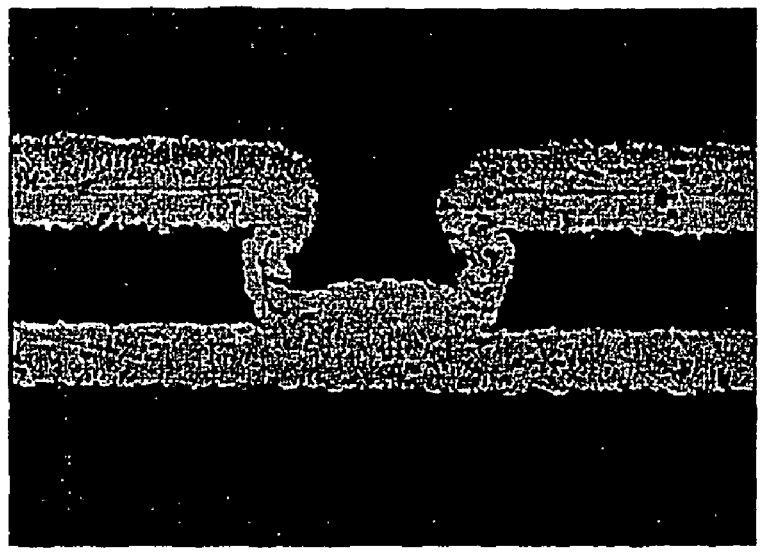

| | | | |
|---|---|---|---|
| 2,707,167 A | 4/1955 | Hoover | |
| 3,101,305 A | 8/1963 | Roth et al. | |
| 3,267,010 A | 8/1966 | Creutz et al. | |
| 3,778,357 A | 12/1973 | Dahms et al. | |
| 4,551,212 A | 11/1985 | Rao et al. | |
| 5,433,840 A | 7/1995 | Dahms et al. | |
| 5,849,171 A | 12/1998 | Dahms et al. | |
| 6,242,602 B1 | 6/2001 | Giri et al. | |
| 6,425,996 B1 | 7/2002 | Dahms et al. | |

FOREIGN PATENT DOCUMENTS

| | | |
|---|---|---|
| DE | 1004880 B | 3/1957 |
| DE | 1152863 | 8/1963 |
| DE | 1165962 | 3/1964 |
| DE | 1218247 | 6/1966 |
| DE | 1246347 | 8/1967 |
| DE | 1521062 | 8/1969 |
| DE | 2028803 | 12/1971 |
| DE | 2039831 | 1/1972 |
| DE | 261 613 A1 | 11/1988 |
| DE | 4032864 A1 | 4/1992 |
| GB | 1357442 A | 6/1974 |
| GB | 2141140 A | 12/1984 |
| GB | 2141141 A | 12/1984 |
| JP | 60056086 * | 4/1985 |
| JP | 60056086 A | 4/1985 |

OTHER PUBLICATIONS

Antonio Cuirado, Alfredo Cerezo, M. Carmen Ramirez de Arellano "One-Pot Synthesis of 1,4-Dichlorophenazines" (1997) pp. 6183-6194.

Hermann Beecken, Hans Musso "Uber die Kondensation von Hydroxy-chinonen mit o-Phenylendiamin and o-Aminophenolen" (Aug. 30, 1960).

* cited by examiner

MIXTURE OF OLIGOMERIC PHENAZINIUM COMPOUNDS AND ACID BATH FOR ELECTROLYTICALLY DEPOSITING A COPPER DEPOSIT

CROSS-REFERENCE TO RELATED APPLICATIONS

This application claims priority to International Application No. PCT/EP2003/013994, filed on Dec. 9, 2003, claiming a priority date of Dec. 20, 2002 (DE 102618526) the complete disclosures of which are herein incorporated by reference.

BACKGROUND OF THE INVENTION

1. Field of the Invention

The invention relates to a mixture of oligomeric phenazinium compounds and to a method of preparing such a mixture. The invention further relates to an acidic bath for electrolytically depositing a copper deposit containing the oligomeric phenazinium compounds as well as to a method of electrolytically depositing a copper deposit using said bath. The mixture of the invention may be utilized as a constituent in copper plating baths to more specifically form highly bright level deposits of copper in order to produce decorative surfaces. The mixture may moreover be utilized as a constituent in copper plating baths for selectively and completely filling blind microvias in printed circuit boards with copper. The mixture may further also be utilized as a constituent in copper plating baths for depositing copper onto semiconductor substrate surfaces provided with recesses (trenches and vias) during the manufacturing of integrated circuits, with the entire semiconductor substrate surface being uniformly coated with copper.

2. Brief Description of the Related Art

For depositing bright copper layers instead of a crystalline matte deposit, organic additives are usually added in small quantities to most of the acidic copper electrolytes. In this approach, an additive compound or a combination of several additive compounds such as polyethylene glycols, thioureas and their derivatives, thio hydantoin, thio carbamic acid esters as well as thio phosphoric acid esters is often added. Nowadays however, the additives mentioned are no longer significant, due to the fact that the quality of the thus obtained copper layers meets by no means today's requirements. The thus obtained coatings are either too brittle or exhibit poor brightness and insufficient levelling.

The utilization of certain safranines and of the derivatives thereof for producing bright copper layers has long been known, said safranines being used, in accordance with DE-PS 947 656, as the only additive, e.g., dimethyl safranine azo dimethyl aniline, diethyl safranine azo dimethyl aniline, Janus grey and safranine azo naphthol. It is moreover known to use said compounds in combination with other additives as well.

DE-AS 1 004 880 suggests the combination of diethyl tolusafranine azo dimethyl aniline, diethyl tolusafranine azo phenol, tolusafranine azo naphthol or dimethyl tolusafranine azo dimethyl aniline or of phenosafranine, tolusafranine, fuchsia, amethyst violet, mauveine, diethyl tolusafranine or dimethyl tolusafranine with thiourea and thiourea derivatives for depositing bright and level copper coatings. Patent Abstract of Japan corresponding to JP 60-056086 A relates to the combination of a phenazine dyestuff with mono- or disulfides such as (3-sodium-sulfopropyl)disulfide and bis-(3-sodium sulfoethyl)disulfide and polyethers for depositing highly bright, level, ductile copper layers. The suggestions made in DE-PS 947 656, DE-AS 1 004 880 and in Patent Abstract of Japan corresponding to JP 60-056086 A however result in copper coatings having unsatisfactory properties.

Further, the utilization of a thiourea-formaldehyde condensate as an additive to an acid copper plating bath has been described: DE-AS 1 152 863 describes pre-condensates of thiourea-formaldehyde being employed as the only leveller used in the bath. The basic brighteners contained in the described baths are compounds of the dithio carbamic acid-type derivatives. DE-AS 1 165 962 describes the use of pre-condensation products consisting of thiourea, formaldehyde and of a compound having at least two $NH_2$ groups in an acidic bath for producing levelling copper coatings. The bath further contains basic brighteners.

DE-AS 1 218 247 discloses an acid electrolytic copper bath for producing highly bright, level copper coatings containing compounds that are hardly soluble in water and are comprised in the molecule of thiocarbonyl groups and aryl or aralkyl residues in a ratio of 1:1, said two groups being separated by hetero atoms that are either bonded to one another or form components of a ring system. These are for example aromatic N-monosubstitution products of thiosemicarbazide, further thiosemicarbazones of aromatic aldehydes, derivatives of thiocarbohydrazide, heterocyclic compounds having a thiocarbonyl group, thiuram mono- and polysulfides, dixanthogen mono- and polysulfides and hydrazine dithio carbonamide. These compounds may be used together with derivatives of sulfones and sulfoxides of the formula RR'N—CS—S—$(CH_2)_n$—$SO_x$—R".

Although the additives disclosed in DE-AS 1 152 863, DE-AS 1 165 962 and DE-AS 1 218 247 also permit to achieve bright copper surfaces, they fall short of today's requirements in practice because of their poor levelling qualities.

Moreover, polyalkylene imines having organic thio compounds have become known: DE-AS 1 246 347 discloses that one or several straight-chained or branched polyalkylene imines or the functional derivatives thereof are advantageous for producing bright, levelling and decoratively attractive copper coatings, with brightness being also achievable over a widened current density range. The functional derivatives more specifically mentioned are the salts of the polyalkylene imines and the products of their reaction with carbon dioxide, esters of carbonic acid, alkyl halogenides or fatty acids. These substances can be utilized in the bath together with other current brighteners and/or wetting agents.

Further, DE-AS 1 521 062 suggests bath compositions containing an organic sulfide that contains at least one sulfonic acid group as well as, mixed thereto or chemically bonded, a polyether that contains at least three, preferably six, oxygen atoms and is free of aliphatic hydrocarbon chains with more than six C-atoms. These baths permit deposition of smooth, bright and ductile copper layers. Preferred polyethers mentioned are 1,3-dioxolane polymerisates having a molecular weight of at least 296, preferably of about 5000. Phenazine dye-stuffs may also be utilized in combination with the bath additives mentioned, for example diethyl phenosafranine azo dimethyl aniline, dimethyl phenosafranine azo dimethyl aniline, diethyl phenosafranine azo phenol and dimethyl azo-(2-hydroxy-4-ethylamino-5-methyl)-benzene. The phenazine dyestuffs permit high levelling and a wide range of bright deposits.

With the copper electrolytes described in DE-AS 1 246 347 and DE-AS 1 521 062 it is not possible to apply a sufficiently high cathodic current density, though. Furthermore, the deposited copper surfaces can only be nickel-plated after having been subjected to an intermediate treatment.

Further, U.S. Pat. No. 4,551,212 discloses the use of a combination of Janus Green B or Janus Black R with Safranine T for depositing copper layers that are machinable in the micrometer range. The properties of these layers are optimized with regard to grain size and hardness. In addition to the phenazine dyestuffs mentioned, the bath may further contain a wetting agent as well as stress relieving agents such as bis-(3-sulfopropyl disulfide)disodium salt.

Moreover, the use of hydroxylated and halogenated safranine dyestuffs has been described in Patent Abstracts of Japan corresponding to JP 60-056086 A.

Like the other documents mentioned herein above, the additives disclosed in U.S. Pat. No. 4,551,212 and in Patent Abstracts of Japan corresponding to JP 60-056086 A only yield results showing poor brilliance and levelling.

DE-AS 20 28 803 and DE-AS 2 039 831 describe for the first time the use of polymeric phenazinium compounds having the general chemical formula <A>:

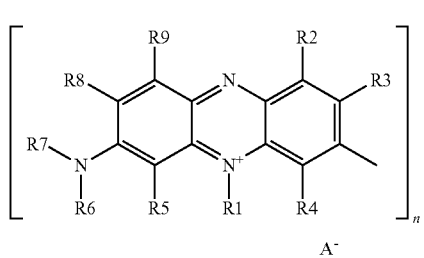

wherein $R^1, R^2, R^3, R^4, R^5, R^6, R^7, R^8$ and $R^9$ are the same or different and are hydrogen, lower alkyl or possibly methyl-, ethyl-, methoxy- or ethoxy-substituted aryl and $R^5$ and $R^8$ further represent mono- or polymeric phenazinium cations, A is an acid residue and n is an integer of from 2 to 100. According to DE-AS 20 39 831, the starting substance for producing these compounds is a sulfuric acid amine such as 2-methyl-3-amino-6-dimethyl-amino-9-phenyl-phenazonium sulfate. Said amine is diazoted with sulfuric acid at −5° C. using nitrosyl sulfuric acid and nitrous acid. The reaction solution is heated to 20° C. after the nitrous acid has been destroyed. Then, the reaction mixture is neutralized with a base.

In principle, deposition of bright and level copper coatings using these compounds in an acid copper plating electrolyte is possible. However, they lead to very unstable results of the copper plating operation.

Therefore the basic object of the present invention is to circumvent the above drawbacks of the known copper baths.

SUMMARY OF THE INVENTION

It is more specifically an object of the present invention to find additives by means of which particularly uniform and brilliant, meaning highly bright, as well as leveled and ductile copper coatings may be reproducibly manufactured.

It is furthermore an object of the present invention to enable production of highly bright, leveled and ductile copper layers applying a relatively high current density.

It is another object of the present invention to find a composition of such a copper plating bath that is able to constantly permit, during bath operation over a long period of time, to obtain copper layers having the required quality.

The solution to the problems outlined herein before is to provide the mixture of oligomeric phenazinium compounds, the method for preparing the mixture of compounds, the acid bath for electrolytically depositing a copper deposit containing the mixture of the oligomeric phenazinium compounds of the invention as well as the method of electrolytically depositing a copper deposit using a bath containing said mixture. Preferred embodiments of the invention are recited in the claims.

The mixture of oligomeric phenazinium compounds in accordance with the invention can advantageously be used in a bath for electrolytically producing a highly bright, leveled copper deposit for the purpose of forming decorative surfaces. Further, the mixture may also be advantageously used in a copper plating bath for electrolytically depositing a copper deposit onto printed circuit boards, with said copper deposit selectively and completely filling blind microvias in printed circuit boards. Moreover, the mixture may also be advantageously utilized in a copper plating bath for electrolytically depositing a copper deposit onto semiconductor substrate (wafer) surfaces provided with recesses (trenches and vias) during the manufacturing of integrated circuits, more specifically onto surfaces having high aspect ratio recesses. The copper deposit is thereby uniformly produced on the entire semiconductor substrate surface.

BRIEF DESCRIPTION OF THE DRAWING FIGURES

Figure 2:
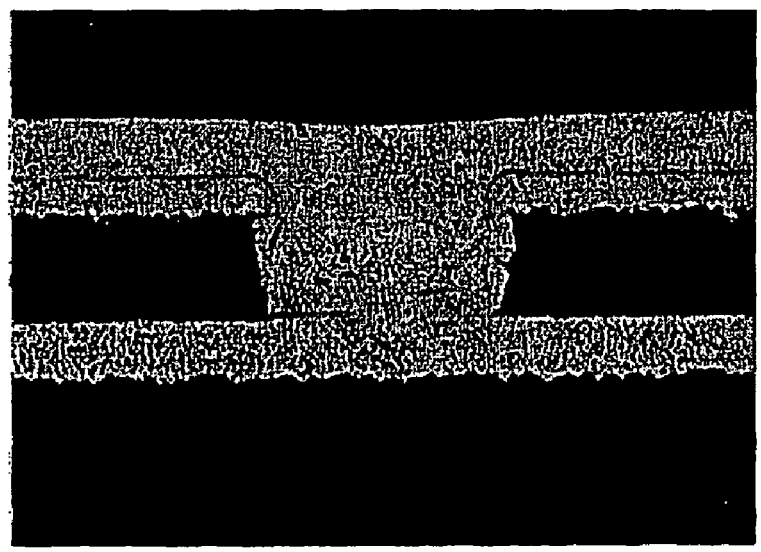

FIG. 1: shows a cross-section of a blind via in a printed circuit board after copper-plating according to Method Example 6 (without using the mixture of the invention);

FIG. 2: shows a cross-section of a blind via in a printed circuit board after copper-plating according to Method Example 7 (using the mixture of the invention).

DETAILED DESCRIPTION OF THE PREFERRED EMBODIMENTS

Mixtures of oligomeric phenazinium compounds of the invention having one of the general chemical formulae <I> and <II> are to be construed herein and in the claims as mixtures of oligomeric phenazinium compounds that only contain at least one of the oligomeric phenazinium compounds mentioned featuring an oligomerization degree of 2 or 3 or mixtures that contain, in addition to said mixtures, small quantities of higher oligomeric phenazinium compounds featuring an oligomerization degree of at least 4. In accordance with the present invention, the content of the higher oligomeric phenazinium compounds featuring an oligomerization degree of at least 4 in the latter mixtures is less than 20 mol-%. At any rate, the mixtures of the invention can be prepared with the method in accordance with the invention. By contrast, the mixtures of the invention cannot be achieved using the methods described in DE-AS 20 28 803 and DE-AS 20 39 831, since these latter methods more specifically yield oligomeric phenazinium compounds featuring an oligomerization degree of >3 (with the content being in excess of 20 mol-%).

The term lower alkyl as mentioned herein and in the claims preferably refers to $C_1$- to $C_8$-alkyl and more preferably $C_1$- to $C_4$-alkyl, meaning methyl, ethyl, n-propyl, iso-propyl, n-butyl, iso-butyl and tert-butyl. By substituted alkyl as mentioned herein and in the claims, sulfo- or carboxyl-substituted alkyl is preferably meant.

Aryl as mentioned herein and in the claims preferably refers to phenyl or polycyclic aromates such as naphthyl-1 and naphthyl-2, wherein these residues may be unsubstituted or substituted, respectively. If these residues are substituted, they are more specifically substituted by alkyl, preferably by lower alkyl, halogen, hydroxy, amino, wherein amino is $NH_2$, NHR or NR'R", wherein R, R' and R" in turn can be lower alkyl, nitrile, thiocyanate and thiol. Phenyl may more specifically be substituted at a 2-, 4- and 6-position.

Heteroaryl as mentioned herein and in the claims preferably refers to pyridinyl, quinolinyl and isoquinolinyl.

COO esters and $SO_3$ esters as mentioned herein and in the claims preferably refer to carboxylic acid esters of the lower alcohols such as $COOCH_3$, $COOC_2H_5$ and so on or to sulfonic acid esters of the lower alcohols such as $SO_3CH_3$, $SO_3C_2H_5$ and so on. By lower alcohols $C_1$- to $C_8$-alcohols, preferably $C_1$- to $C_4$-alcohols i.e., methanol, ethanol, n-propanol, iso-propanol, n-butanol, iso-butanol and tert-butanol, are meant. COO salts and $SO_3$ salts as mentioned herein and in the claims refer to carboxylic acid salts and sulfonic acid salts, respectively, meaning more specifically the alkali salts, earth alkali salts, aluminium salts and copper salts such as $Na^+COO^-$ or $Cu^{2+}(SO_3^-)_2$.

Halogen as mentioned herein and in the claims refers to fluorine, chlorine, bromine and iodine, preferably to chlorine.

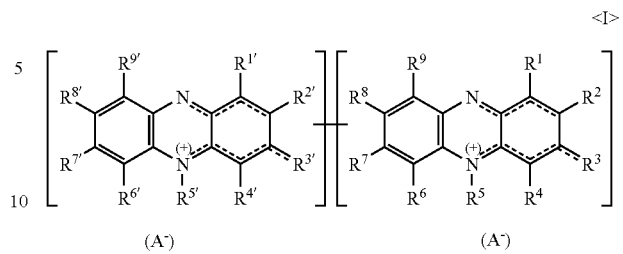

and compounds containing three monomeric units according to the following general chemical formula <II>:

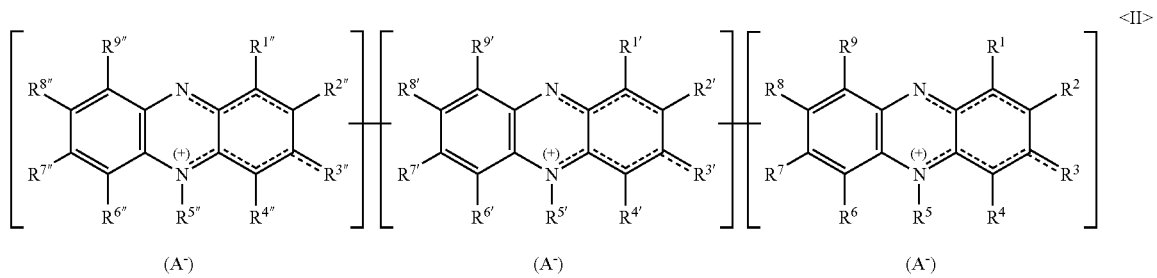

For the purpose of numbering the skeleton carbon atoms in the phenazinium monomeric units, the IUPAC Nomenclature will be taken as a basis herein and in the claims, but in the case of doubt the structures expressed in chemical structure formulae herein will have priority.

The solution to the basic object of the invention is a novel mixture of oligomeric phenazinium compounds that may be advantageously utilized in an acid copper plating electrolyte.

The mixture of oligomeric phenazinium compounds of the invention is obtainable using a method by which, in a one-pot reaction, a monomeric phenazinium compound or a mixture of several monomeric phenazinium compounds is diazoted and the obtained diazonium compounds are reacted by forming the mixture of oligomeric phenazinium compounds.

By contrast, the mixture of oligomeric phenazinium compounds of the invention cannot be obtained using the methods described in DE-AS 20 28 803 and DE-AS 20 39 831. It has been found that the mixture of the invention can only be prepared using the method in accordance with the invention.

The oligomeric phenazinium compounds in the mixture of the invention are characterized in that they are dimeric or trimeric and [0033] 1. that they may more specifically contain one or several hydroxy groups, or better, halogen atoms, [0034] 2. and/or that it is preferred that not every phenazine monomeric unit must carry a charge, [0035] 3. and/or that the compounds in the molecule can preferably contain differing phenazine monomeric units.

Therefore, the invention is more specifically characterized in that the mixture of oligomeric phenazinium compounds contains at least one phenazinium compound selected from the group comprising compounds containing two monomeric units according to the following general chemical formula <I>:

as well as further oligomeric phenazinium compounds. In the event the mixture of the invention exclusively contains compounds having two and/or three monomeric units, apart from the compounds having the general chemical formulae <I> and <II>, any other oligomeric phenazinium compounds contained in the mixture also have two and/or three monomeric units. In this case, the other oligomeric phenazinium compounds can also have the general chemical formulae <I> and <II>. In the event the mixture of the invention does not exclusively contain compounds having two and/or three monomeric units, but other oligomeric phenazinium compounds as well, said other oligomeric phenazinium compounds are oligomers featuring an oligomerization degree of 4 or more. These other compounds may more specifically have, in the respective monomeric units, the substitution patterns indicated in the above mentioned general chemical formulae <I> and <II>.

The structure unit $N(R^{5/5'/5''})CC(R^{4/4'/4''})C(R^{3/3'/3''})$ therein is denoted by one of the following general chemical formulae <IIIa> or <IIIb>:

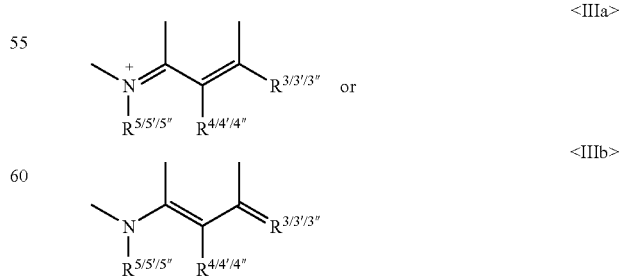

In the general chemical formulae <I> and <II>, $R^1$, $R^2$, $R^3$, $R^4$, $R^5$, $R^6$, $R^7$, $R^8$, $R^9$, $R^{1'}$, $R^{3'}$, $R^{4'}$, $R^{5'}$, $R^{7'}$, $R^{8'}$, $R^{9'}$, $R^{1''}$, $R^{2''}$, $R^{3''}$, $R^{4''}$, $R^{5''}$, $R^{6''}$, $R^{7''}$, $R^{8''}$ and $R^{9''}$ denote each independently the following: hydrogen, halogen, amino, wherein amino may more specifically be unsubstituted or substituted by lower alkyl, further OH, CN, SCN, SH, COOH, COO salt, COO ester, $SO_3H$, $SO_3$ salt, $SO_3$ ester, lower alkyl, wherein the alkyl can also be substituted, further aryl and heteroaryl. Moreover, these residues may also be a single bond that links the individual monomeric units together. As the cross-linkage point of the respective monomeric units is of no importance for the effect of the mixture of the invention in a copper plating bath, each of the residues mentioned $R^1$, $R^2$, $R^3$, $R^4$, $R^5$, $R^6$, $R^7$, $R^8$, $R^9$, $R^{1'}$, $R^{2'}$, $R^{3'}$, $R^{4'}$, $R^{5'}$, $R^{6'}$, $R^{7'}$, $R^{8'}$, $R^{9'}$, $R^{1''}$, $R^{2''}$, $R^{3''}$, $R^{4''}$, $R^{5''}$, $R^{6''}$, $R^{7''}$, $R^{8''}$ and $R^{9''}$ may equivalently represent a single bond. The two outer monomeric units of trimeric compounds can be bonded to the same or to different $C_{6-}$ rings of the central monomeric unit.

$R^5$, $R^{5'}$ and $R^{5''}$ denote each independently the same as $R^1$, $R^2$, $R^3$, $R^4$, $R^5$, $R^6$, $R^7$, $R^8$, $R^9$, $R^{1'}$, $R^{2'}$, $R^{3'}$, $R^{4'}$, $R^{5'}$, $R^{6'}$, $R^{7'}$, $R^{8'}$, $R^{9'}$, $R^{1''}$, $R^{2''}$, $R^{3''}$, $R^{4''}$, $R^{5''}$, $R^{6''}$, $R^{7''}$, $R^{8''}$ and $R^{9''}$ but with the proviso that they do not represent a single bond. This means that each of the two or three monomeric units in the oligomeric phenazinium compounds can be bonded to another monomeric unit through each of the skeleton carbon atoms. A bond through a nitrogen atom is out of the question, though.

Further, $R^2$, $R^{2'}$, $R^{2''}$, $R^3$, $R^{3'}$ and $R^{3''}$ may also be selected from the group comprising oxo, imino and methylene with the proviso that a monomeric unit substituted by oxo, imino or methylene has the structure unit $N(R^{5/5'/5''})CC(R^{4/4'/4''})C(R^{3/3'/3''})$ of the general chemical formula <IIIb>. This means that in this case, a quinoid structure forms in the ring, oxo, imino or methylene being bonded thereto. In this context, it has further to be taken into consideration that the various monomeric units display mirror-image symmetry so that, instead of $R^2$, $R^{2'}$, $R^{2''}$, $R^3$, $R^{3'}$ and $R^{3''}$ also the residues $R^7$, $R^{7'}$, $R^{7''}$, $R^8$, $R^{8'}$ and $R^{8''}$ may be oxo, imino or methylene since these latter residues are interchangeable with the previous ones. In the oligomeric phenazinium compound comprised of three monomeric units, oxo, imino and methylene may be preferably bonded to the two outer monomeric units.

If $R^2$, $R^{2'}$, $R^{2''}$, $R^3$, $R^{3'}$ and $R^{3''}$ are not oxo, imino or methylene, the structure unit $NCC(R^{1/1'/1''})C(R^{2/2'/2''})$ further has one of the following general chemical formulae <IVa> or <IVb>:

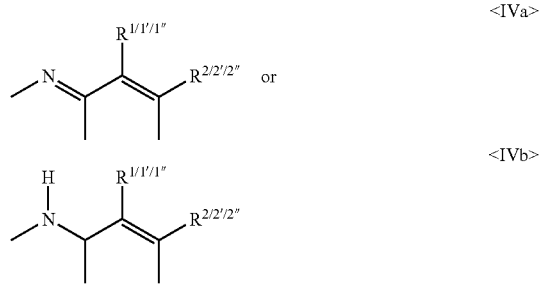

<IVa>
<IVb>

In the general chemical formulae <I> and <II> $A^-$ is an acid anion. It is to be kept in mind that $A^-$ may be anion with one negative charge or with more than one negative charge. The molar ratio of the phenazinium cation to the $A^-$ anion of course depends on the relative charges.

In accordance with the invention, the content of all of the oligomeric phenazinium compounds having the general chemical formulae <I> and <II> is of at least 80 mol-% in the mixture.

In producing the known polymeric compounds with the conventional two-stage production process (diazotation and subsequent formation of the oligomeric phenazinium compounds) according to DE-AS 20 39 831, the compositions obtained often greatly differ and feature different degrees of polymerization, these substances having different effects in the electrolyte as a result thereof. Furthermore, the high molecular weight polymeric phenazinium cations featuring an oligomerization degree in excess of 5 exhibit poor solubility in the copper electrolyte where they are only allowed to act in a very restricted way.

The mixture of the invention cannot be prepared using the method known from DE-AS 20 39 831. Therefore, the novel synthesis method in the field of the safranine additives constitutes a decisive improvement over known methods.

Accordingly, those mixtures of oligomeric phenazinium compounds which are obtained by diazotation of a safranine or of a mixture of several safranines and by reacting the resulting diazonium compounds in a one-pot reaction to form the oligomeric phenazinium compounds, are more specifically the subject matter of the present invention.

The novel one-pot reaction method permits to obtain a mixture that mainly contains dimeric and trimeric phenazinium cations and is largely free of polymeric structures. Further, such oligomeric phenazinium compounds have been found to be advantageous that contain dimers and trimers having a positive-charge deficit so that these dimers and trimers are in parts only single or double charged, respectively.

Furthermore, those dimers and trimers are found to be advantageous in the mixture of the invention that contains halogenated oligomeric phenazinium cations. They show much higher activity than the halogenated monomers or polymers featuring a higher degree of polymerization. It could for example be shown that the pure halogenated polymeric safranine dyestuffs often show but poor electroplating activity.

Further, those additives show an increased electroplating activity that contain trimers and dimers having differing monomeric units resulting from either codimerization or cotrimerization of different safranine dyestuffs or from a partial degradation of the above mentioned compounds during the reaction procedure in which the oligomeric phenazinium compounds are formed from the diazonium compounds.

In using the mixture of the invention in an acid electrolytic copper plating bath, it is possible to operate said bath at a high current density. Moreover, in combination with other prior art additives, it makes it possible to form uniform, brilliant copper deposits. Further, the efficiency of the oligomeric phenazinium dyestuffs is greatly increased by the synthesis thereof in accordance with the invention. By adding the special mixture of oligomeric phenazinium compounds of the invention to a copper electrolyte, outstanding brilliance is therefore obtained with much less concentration of the utilized additives than by using conventional monomeric or polymeric phenazinium compounds. This allows for much greater efficiency and, as a result thereof, profitability.

Further, the solubility of the dimeric and trimeric additives is surprisingly better than that of the polymeric phenazinium compounds. Moreover, the synthesis is substantially simplified by a one-stage method in the presence of catalysts.

In particularly preferred compounds contained in the mixture of the invention, at least one of the residues selected from the group comprising $R^2$, $R^{2'}$, $R^{2''}$, $R^3$, $R^{3'}$, $R^{3''}$, $R^7$, $R^{7'}$, $R^{7''}$, $R^8$, $R^{8'}$ and $R^{8''}$ has one of the meanings selected from the group comprising halogen and hydroxy. In a particularly preferred embodiment in accordance with the invention, hydroxy and halogen in the trimeric phenazinium compound are bonded to the two outer monomeric units at the designated substitution sites so that at least one of the residues selected from the group comprising $R^2$, $R^3$, $R^{7''}$ and $R^{8''}$ in the oligomeric phenazinium compounds according to the general chemical formula <II> has one of the meanings selected from the group comprising halogen and hydroxy. These compounds are characterized in that they yield outstanding brilliance in copper deposition well into ranges of lowest current density.

Mixtures are further preferred in which at least one of the residues selected from the group comprising $R^2$, $R^{2'}$ and $R^{2''}$ represents lower alkyl, more specifically methyl or ethyl. Such type compounds are easily accessible by synthesis.

Further, such mixtures are preferred in which at least one of the residues selected from the group comprising $R^7$, $R^{7'}$, $R^{7''}$ represents an alkylated amine, more specifically an amine which is mono- or disubstituted with lower alkyl and most preferably N-methylamine, N-ethylamine, N,N-dimethylamine and N,N-diethylamine. The advantage of an extremely high electroplating efficiency is achieved using such type phenazinium compounds in the mixture of the invention.

It is further advantageous to utilize mixtures in which at least one of the residues selected from the group comprising $R^5$, $R^{5'}$ and $R^{5''}$ represents methyl or an aryl, with aryl more specifically being phenyl or tolyl. These mixtures have the advantage to yield optimum results even at lowest dosage in the copper electrolyte so that the deposition method is very profitable. The aryl group hereby shows a clearly enhanced electroplating effect over an alkyl group.

It has also been found advantageous to use mixtures in which the acid anion $A^-$ is selected from the group comprising sulfate, hydrogen sulfate, halide, tetrafluoroborate, hexafluorophosphate, nitrate, acetate, trifluoroacetate and methanesulfonate. By halide the species fluoride, chloride, bromide and iodide are meant. Mixtures containing these acid anions are particularly well suited for use in electrolytic acid copper plating baths because they do not negatively influence the deposition conditions. Moreover, dimeric and trimeric phenazinium compounds having these acid anions exhibit good solubility in the copper plating baths.

In particularly efficient mixtures of the invention the dimeric and/or trimeric phenazinium compounds have the following general chemical formulae <V>, <VI>, <VII> and <VIII>:

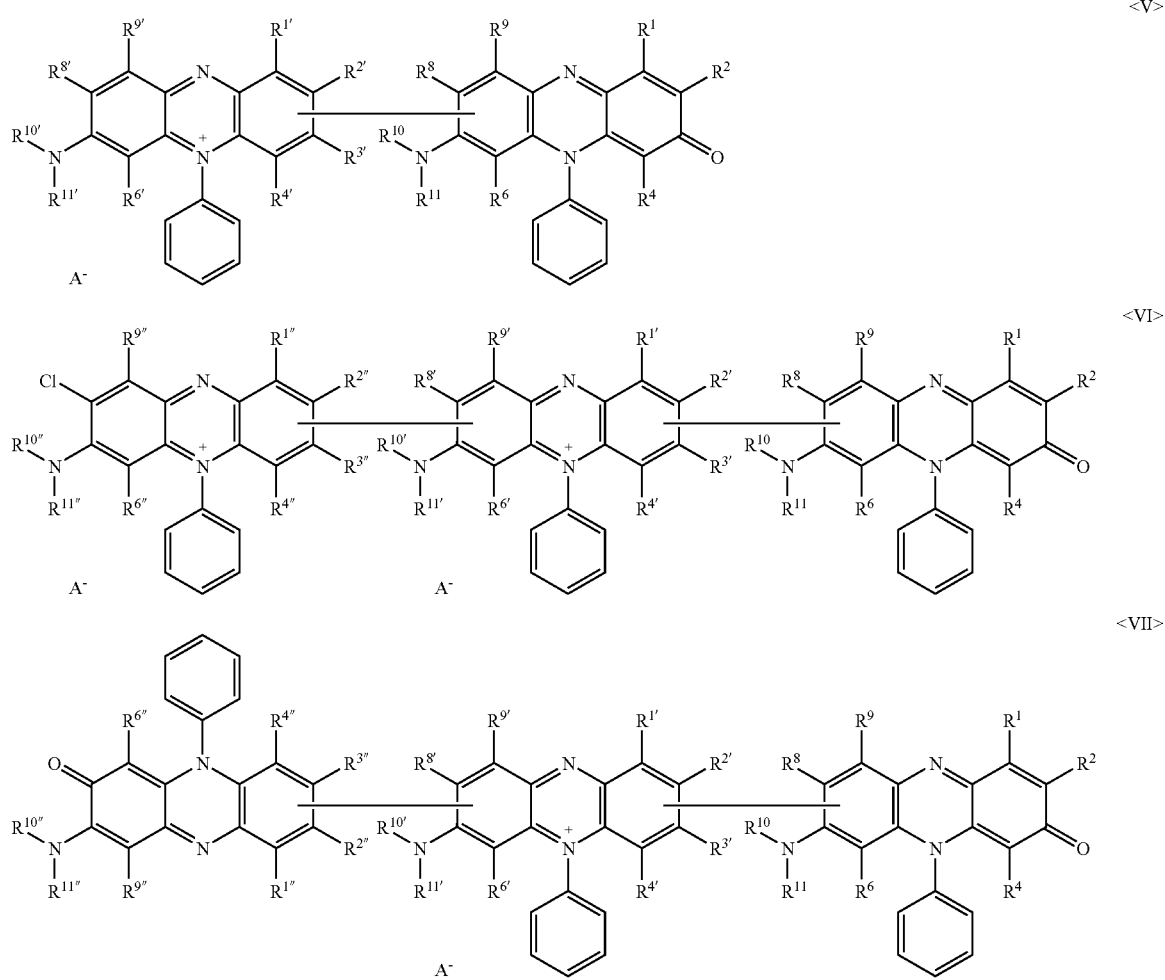

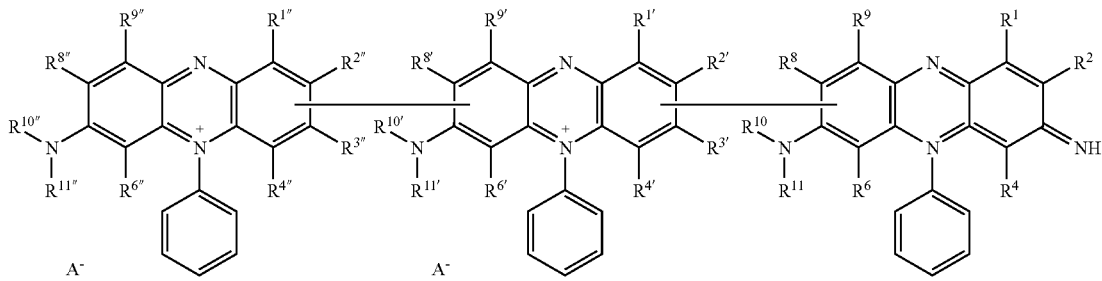

<VIII> wherein $R^1$, $R^2$, $R^3$, $R^4$, $R^5$, $R^6$, $R^7$, $R^8$, $R^9$, $R^{1'}$, $R^{2'}$, $R^{3'}$, $R^{4'}$, $R^{5'}$, $R^{6'}$, $R^{7'}$, $R^{8'}$, $R^{9'}$, $R^{1''}$, $R^{2''}$, $R^{3''}$, $R^{4''}$, $R^{5''}$, $R^{6''}$, $R^{7''}$, $R^{8''}$ and $R^{9''}$ have the above mentioned meanings and wherein $R^{10}$, $R^{11}$, $R^{10'}$, $R^{11'}$, $R^{10''}$ and $R^{11''}$ represent hydrogen or lower alkyl.

In these cases, bivalent oxo-groups, imino-groups or methylene groups are present so that a charge deficit forms in the oligomeric phenazinium compound as a result of the formation of respective quinoid structures. These structures also are highly efficient.

In these compounds all of the residues $R^1$, $R^2$, $R^3$, $R^4$, $R^5$, $R^6$, $R^7$, $R^8$, $R^9$, $R^{10}$, $R^{11}$, $R^{1'}$, $R^{2'}$, $R^{3'}$, $R^{4'}$, $R^{5'}$, $R^{6'}$, $R^{7'}$, $R^{8'}$, $R^{9'}$, $R^{10'}$, $R^{11'}$, $R^{1''}$, $R^{2''}$, $R^{3''}$, $R^{4''}$, $R^{5''}$, $R^{6''}$, $R^{7''}$, $R^{8''}$, $R^{9''}$, $R^{10''}$, and $R^{11''}$ may each independently have one of the meanings selected from the group comprising hydrogen or lower alkyl such as methyl or ethyl. $A^-$ denotes a counter anion as described herein above, preferably chloride, hydrogen sulfate or tetrafluoroborate.

These compounds in the mixture of the invention have the advantage that they impart good leveling in addition to good brightness.

The following monomeric units in the mixture in accordance with the invention have proved particularly efficient as they show outstanding brilliance both at high and at low current density with clearly less concentration thereof in the copper electrolyte:

a) 7-N,N-dimethylamino-3-hydroxy-2-methyl-5-phenyl-phenazinium of the following chemical formula:

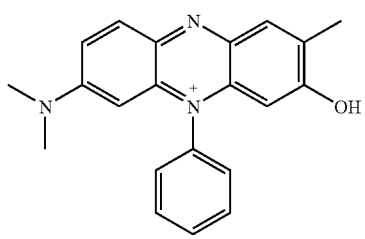

<a> b) 3-chlorine-7-N,N-dimethylamino-5-phenyl-phenazinium of the following chemical formula:

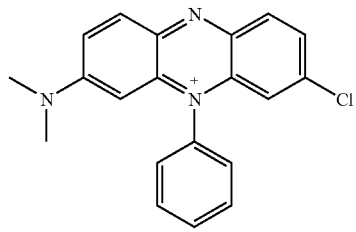

<b> c) 8-dimethylamino-10-phenyl-10H-phenazine-2-one of the following chemical formula:

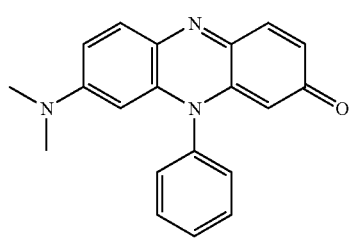

<c> d) 2-N,N-dimethylamino-10-phenyl-5,10-dihydrophenazine of the following chemical formula:

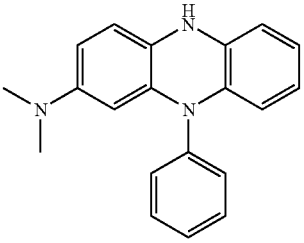

<d> e) 3-N-ethylamino-7-hydroxy-5-phenyl-phenazinium of the following chemical formula:

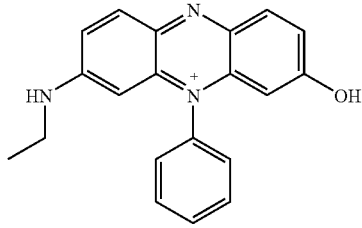

f) 3-chlorine-7-N-ethylamino-5-phenyl-phenazinium of the following chemical formula:

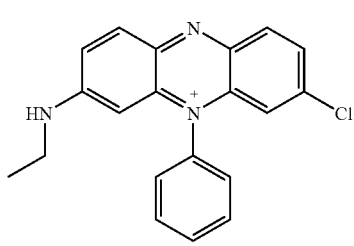

g) 3-methyl-8-N-methylamino-10-phenyl-10H-phenazine-2-one of the following chemical formula:

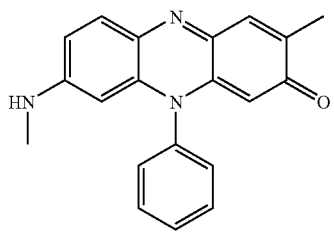

h) 7-N-methylamino-2-methyl-5-phenyl-5,10-dihydrophenazine of the following chemical formula:

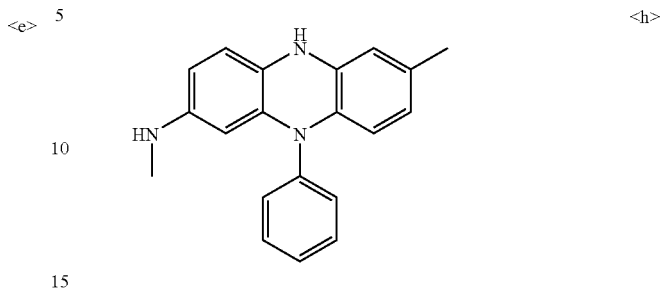

The following oligomeric phenazinium compounds were detected in the mixture of the invention and are perfectly suited for electrolytic copper deposition at high current density with a reduced tendency to form burns:

i. 3'-N,N-dimethylamino-3,8'-dimethyl-8-(N-methylamino)-7'-oxo-10,5'-dipheny-1-5',7'-dihydro-[2,2']biphenazinyl-10-ium-chloride

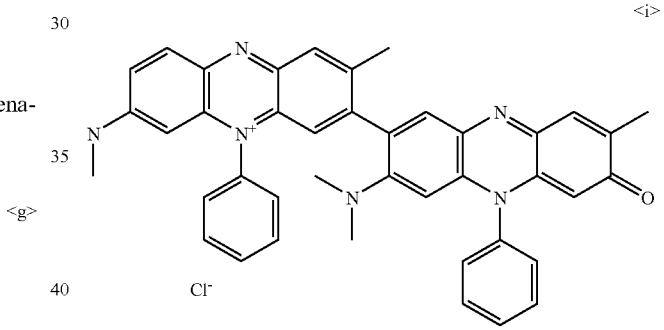

ii. 3,8',8"-trimethyl-8,3',3"-tris-(N-methylamino)-7"-oxo-10,5',5"-triphe-nyl-5',10',5",7"-tetrahydro-[2,2'; 7',2"]terphenazine-10-ium-chloride

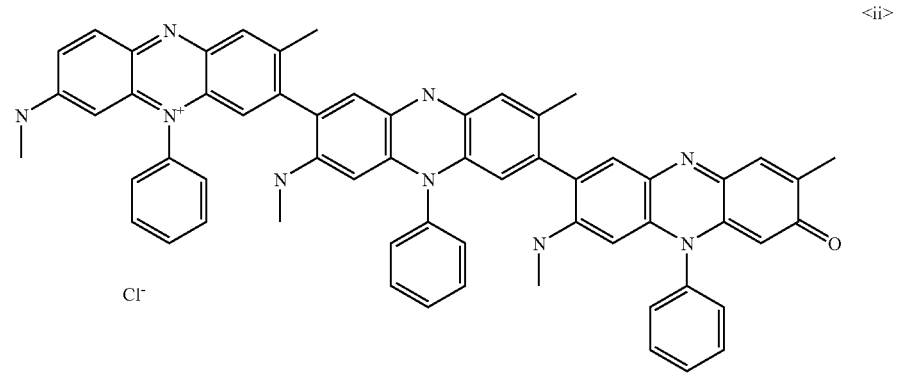

iii. 8,3'-bis-(N,N-dimethylamino)-8'-methyl-7'-oxo-10,5'-diphenyl-5',7'-dihydro-o-[2,2']biphenazinyl-10-ium-hydrogen sulfate

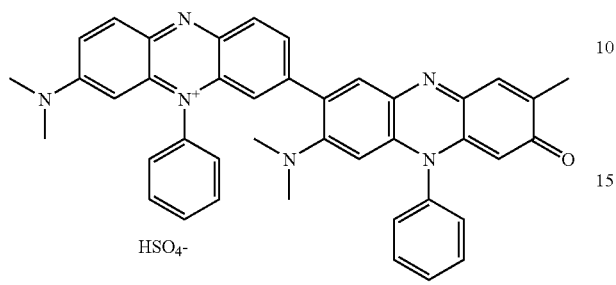
<iii>

Further substances of the invention with very good effect are:

iv. 8,8'-bis-(N,N-dimethylamino)-3,3'-dimethyl-10,10'-diphenyl-[2,2']biphenaz-inyl-10,10'-ium-tetrafluoroborate

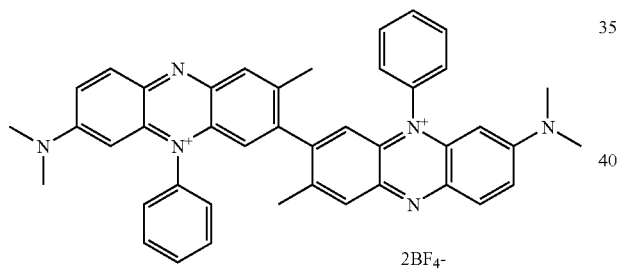
<iv> v. 8,8'-bis-(N,N-dimethylamino)-10,10'-diphenyl-3-methyl-[2,2']biphenazinyl-10,10'-ium-tetrafluoroborate

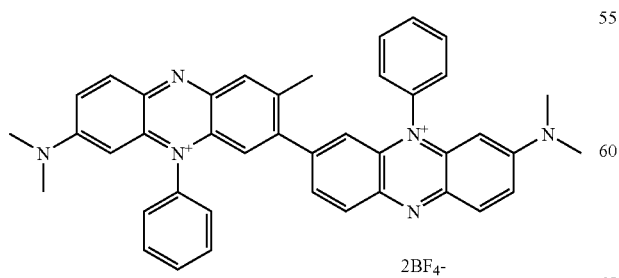
<v> vi. 3,8'-bis-(N,N-dimethylamino)-8,3'-dimethyl-5,10'-diphenyl-7-hydroxy-[2,2'-]biphenazinyl-5,10'-ium-tetrafluoroborate

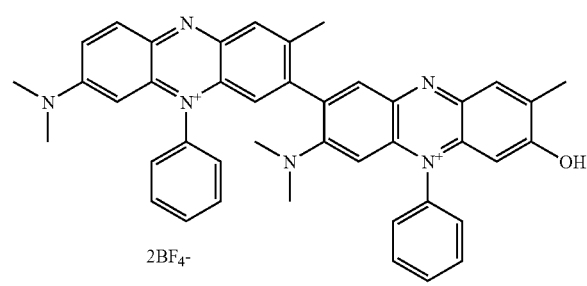
<vi> vii. 3,8'-bis-(N,N-dimethylamino)-8,3'-dimethyl-5,10'-diphenyl-7-hydroxy-[2,2'-]biphenazinyl-5,10'-ium-chloride

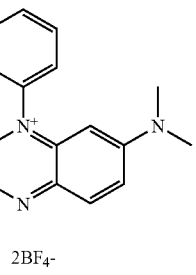
<v> viii. 3,8',8''-tris-(N,N-dimethylamino)-8-methyl-5,10',10''-triphenyl-[2,2';7',-2'']terphenazine-5,10',10''-ium-tetrafluoroborate

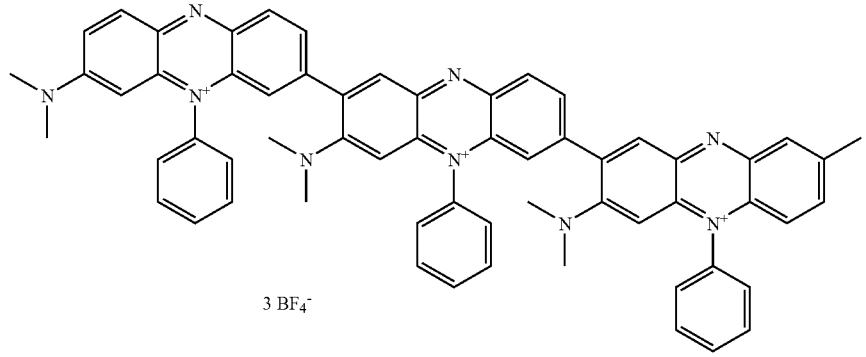

ix. 8'-N,N-diethylamino-8-N,N-dimethylamino-3-methyl-10,10'-diphenyl-[2,2']bi-phenazinyl-10,10'-ium-sulfate x. 8'-N,N-diethylamino-3-N,N-dimethylamino-7-hydroxy-8-methyl-5,10'-diphenyl--[2,2]biphenazinyl-6,10'-ium-sulfate

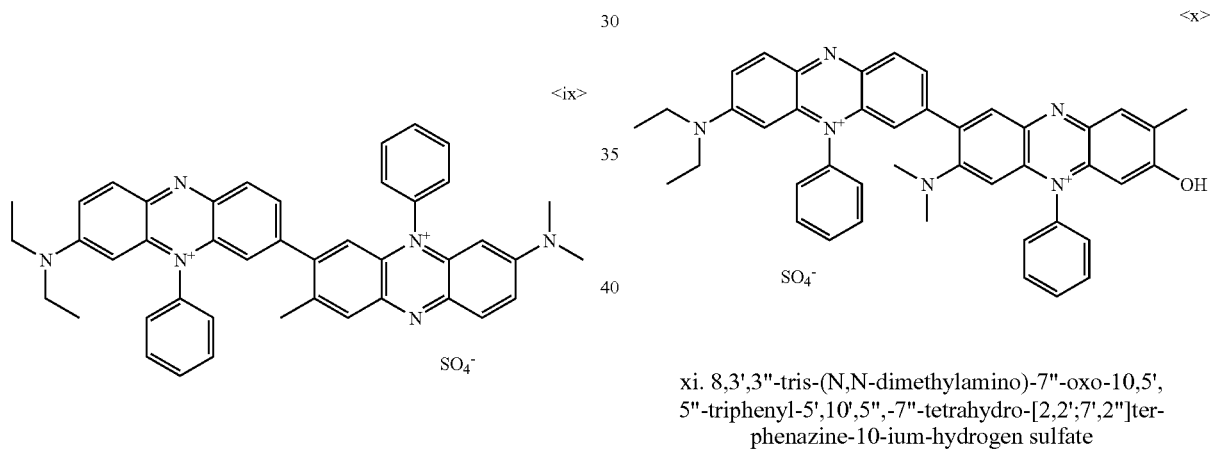

xi. 8,3',3''-tris-(N,N-dimethylamino)-7''-oxo-10,5',5''-triphenyl-5',10',5'',-7''-tetrahydro-[2,2';7',2'']terphenazine-10-ium-hydrogen sulfate

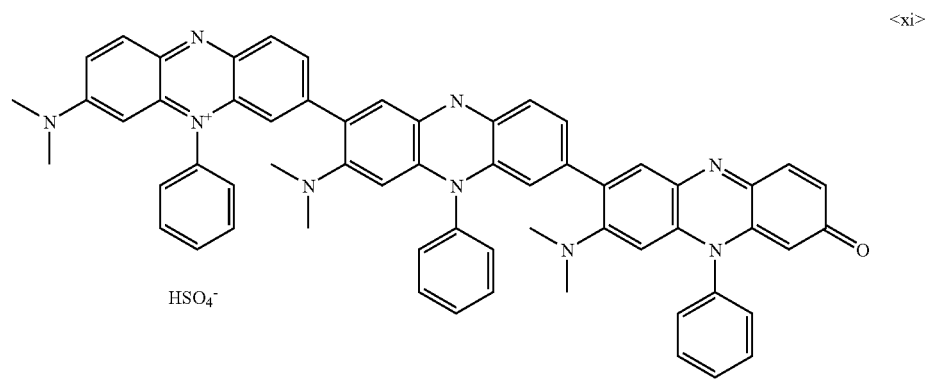

xii. 3,8'-bis-(N,N-diethylamino)-7-hydroxy-5,10'-diphenyl-[2,2']biphenazi-nyl-6,10'-ium-sulfate xiv. 7-chlorine-3,8'-bis-(N,N-dimethylamino)-8,3'-dimethyl-5,10'-diphenyl-[2,2-']biphenazinyl-5,10'-ium-chloride xiii. 7-chlorine-3,8'-bis-(N,N-dimethylamino)-5,10'-diphenyl-8-methyl-[2,2']biphenazinyl-5,10'-ium-chloride xv. 7-chlorine-3,8'-bis-(N,N-dimethylamino)-5,10'-diphenyl-[2,2]biphenazinyl- -5,10'-ium-chloride

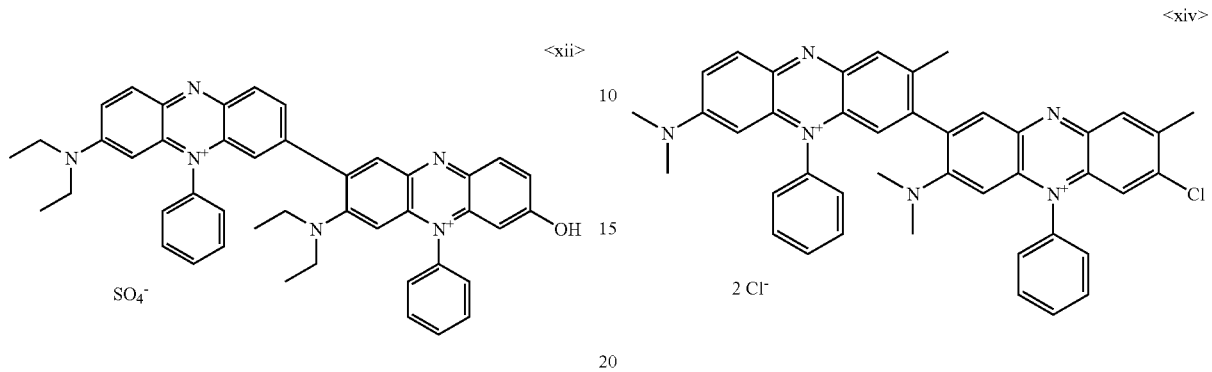

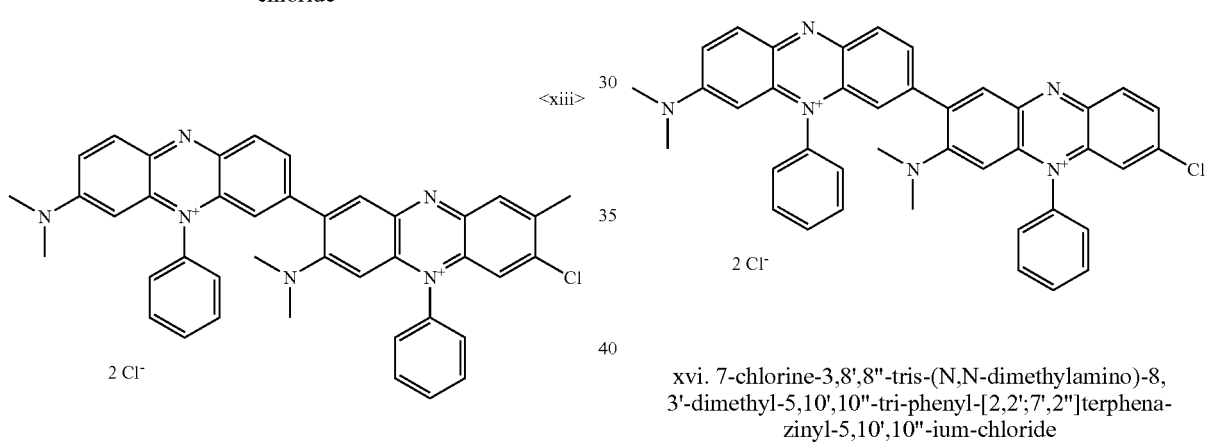

xvi. 7-chlorine-3,8',8"-tris-(N,N-dimethylamino)-8,3'-dimethyl-5,10',10"-tri-phenyl-[2,2';7',2"]terphena-zinyl-5,10',10"-ium-chloride

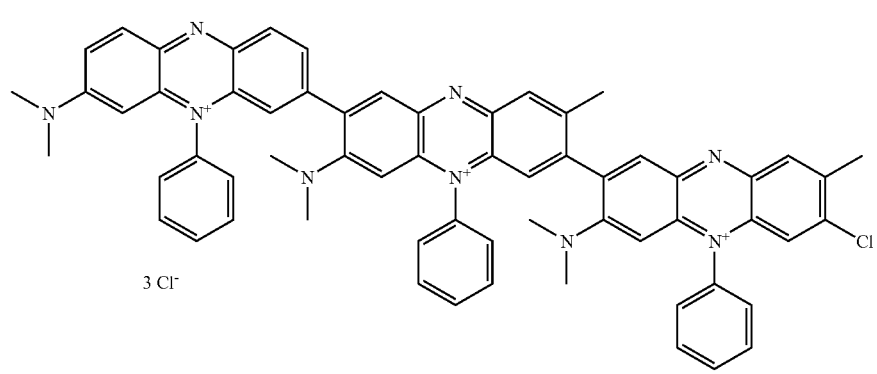

21 xvii. 7-chlorine-8,1'-dimethyl-8'-N,N-dimethylamino-5,10'-diphenyl-[2,2]biphenazinyl-5,10'-ium-chloride

22 xviii. 8,8'-bis-(N,N-dimethylamino)-10,10'-dimethyl-[2,2']biphenazinyl-10,10'-ium-hydrogen sulfate

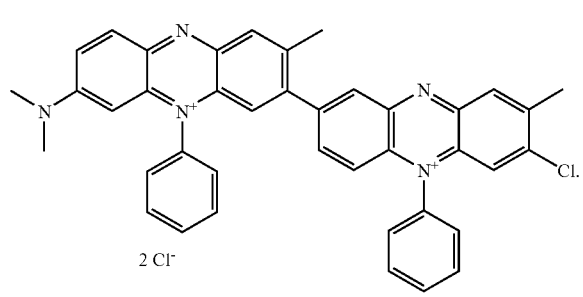

xix. 8,3',3''-tris-(N,N-dimethylamino)-7''-oxo-10,5', 5''-triphenyl-5'',7''-dihydro-[2,2';7',2'']terphenazine-10,5'-ium-hydrogen sulfate

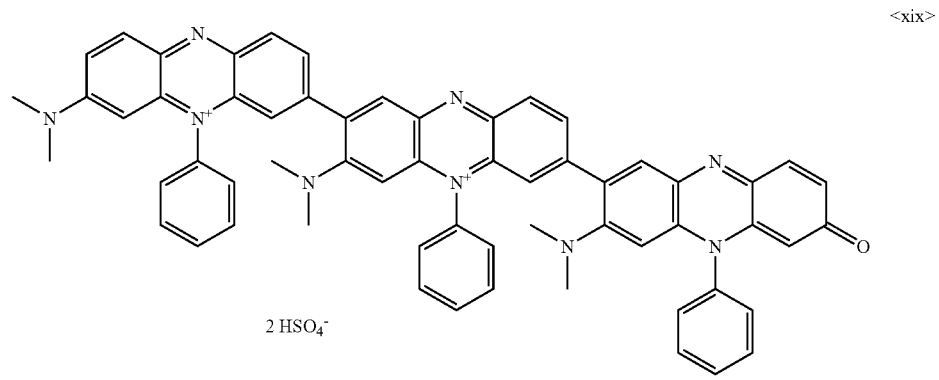

xx. 8,3',3''-tris-(N,N-dimethylamino)-8-methyl-5,10', 10''-triphenyl-[2,2';7',-2'']terphenazine-5,10',10''-ium-tetrafluoroborate

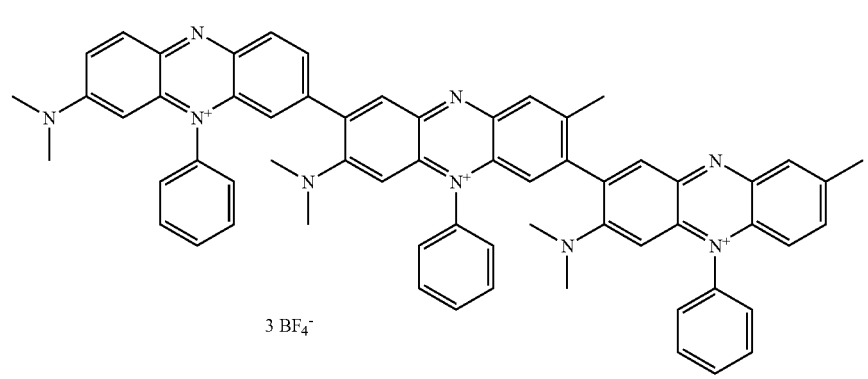

xxi. 8,8'-bis-(N,N-dimethylamino)-10,10'-diphenyl-[2,2']biphenazinyl-10,10'-ium-tetrafluoroborate

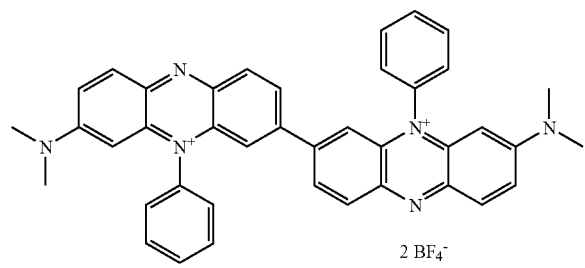

xxii. 8,8'-bis-(N-methylamino)-3-chlorine-10,10'-diphenyl-[2,2']biphenazinyl-10-,10'-ium-chloride

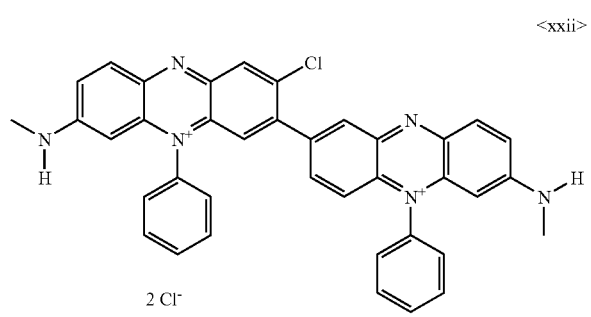

xxiii. 3,3',3''-tris-(N-methylamino)-8''-chlorine-5,5',5''-triphenyl-[8,2';8',7'-]terphenazine-5,5',5''-ium-chloride Identity and content of the dimeric and trimeric phenazinium compounds in the mixture of the invention can be determined using the following methods:

To identify and quantify the compounds contained in the mixture in accordance with the invention, mass spectrometry is more specifically utilized in the present case, with the spectra being preferably recorded under the following conditions: by means of electron spray ionization, coupled to a quadrupole mass spectrometer (ESUMS) or to a quadrupole ion trap (ESI/QIT-MS), by means of Atmospheric Pressure Matrix Assisted Laser Desorption Ionization, coupled to a quadrupole ion trap (AP-MALDI/QIT-MS), or by means of Matrix Assisted Laser Desorption Ionization, coupled to a time of flight mass spectrometer (MALDI-TOF). The MALDI methods are preferred. To quantitatively determine the compounds, the sum of all the signals in the mass spectrum is set to 100 mol-%. The height of the individual signals detected is related thereto. It is thereby assumed that ionizability and sensitivity for the assignable molecule peaks are equally high.

Alternatively, the oligomeric phenazinium compounds can also be determined quantitatively using another method by which a mass spectrometer is coupled to a high performance liquid chromatography unit (LC-MS-coupling) for the purpose of assigning the individual peaks in the HPLC-chromatogram through the mass spectrum. After a first identification in a reference mixture by means of LC-MS coupling, the quantitative determination may then be performed without LC-MS-coupling by taking into consideration the retention time of the peaks for identification.

Alternatively, the HPLC-method may also be used to quantitatively determine the oligomeric phenazinium compounds in the mixture, gel permeation chromatography being more specifically utilized. For improved separation of the positively charged compounds, anionic wetting agents may be added in this case to the solvent (eluent) in order to form ion pairs (ion-pair chromatography).

The oligomeric phenazinium compounds having the structures described herein above and contained in the mixtures of the invention can be obtained in a sequence of diazotation and reacting the diazonium compounds formed to the oligomeric phenazinium compounds in a one-pot reaction by transforming monomeric phenazinium compounds of the following general chemical formula <IX>:

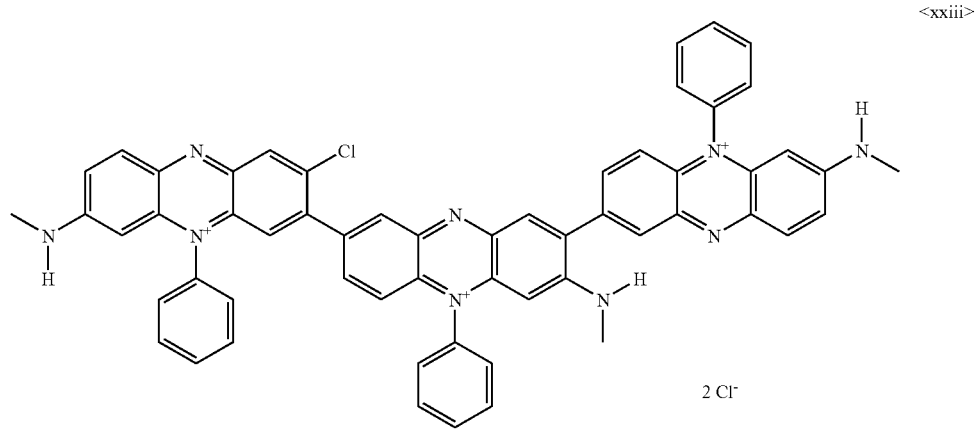

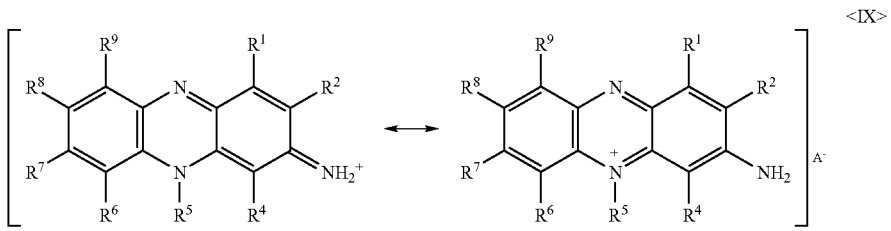

wherein $R^1, R^2, R^3, R^4, R^5, R^6, R^7, R^8$ and $R^9$ have the same meanings as given before for the oligomeric phenazinium compounds of the general chemical formulae <I> and <II>.

By the term "one-pot reaction" is meant that the synthesis of the oligomeric phenazinium compounds may be carried out in but a single reaction vessel without removing any intermediate products, such as the diazonium compounds as mentioned. It would not defeat the purpose of the invention to transfer the intermediate product without further substantial work-up, i.e., without drying, to another reaction vessel. If the reaction could take place in a single reaction vessel of sufficient size, the synthesis should still be considered a one-pot reaction even if more than one reaction vessel is actually used.

The reaction is preferably run using nitrite, more specifically sodium nitrite, or nitrosyl sulfuric acid in acid, preferably mineral acid such as hexafluoro-phosphoric acid, phosphoric acid, hydrobromic acid, and most preferably hydrochloric acid, sulfuric acid, tetrafluoroboric acid and the mixtures thereof.

For synthesis, such safranine dyestuffs can be preferably utilized in which $R^1$, $R^4$, $R^6$ and $R^9$ each represent hydrogen, $R^5$ represents phenyl and $R^7$ represents $NR^{10}R^{11}$ wherein $R^{10}$ and $R^{11}$ each independently have one of the aforementioned meanings given for the same residues in the general chemical formulae <V>, <VI>, <VII> and <VIII>, more specifically hydrogen and lower alkyl.

The oligomeric phenazinium compounds in the mixture of the invention may be produced in a one-pot reaction also using different monomeric phenazinium compounds of the aforementioned general chemical formula <IX>.

The diazonium salts may thereby be reacted to the oligomeric phenazinium compounds in-situ and the reaction may be run in the presence of suited catalysts such as alkali xanthogenates, alkali thiocyanates, alkali selenocyanates and above all in the presence of transition metals and their compounds such as elemental copper and the compounds thereof, for example copper(I)- and copper(II)-halides, copper oxides as well as the corresponding copper pseudohalides, nickel, palladium and iron. The catalyst is preferably in powder form.

The in-situ method of the invention is a one-pot method in which sodium nitrite or nitrosyl sulfuric acid are slowly added to the dyestuffs suspended in the mineral acid, with or without the catalysts described herein above, at an increased temperature, preferably at a temperature of at least 15° C. and particularly at a temperature of 30-65° C., so that separate previous diazotation followed by reaction for forming the oligomeric phenazinium compounds is not carried out.

After the reaction has been terminated, the reaction product is preferably introduced in caustic soda lye or in potassium lye or it is set to a sulfuric acid titer of <1 wt.-% and the resulting solid is filtered off.

The method of preparation in accordance with the invention will be explained with the following examples:

Preparation Example 1

1 g of 3-amino-7-N,N-dimethylamino-2-methyl-5-phenyl-phenazinium chloride and 174 mg of copper powder were suspended in 15 ml of 50 percent by weight tetrafluoroboric acid and heated to 65° C. Then, a saturated aqueous sodium nitrite solution (570 mg in 10 ml of water) was slowly added dropwise followed by stirring over another half an hour at this temperature. The reaction product was cooled down to room temperature and the reaction mixture introduced in a 50 percent by weight caustic soda lye. The resulting black solid was filtered off and dried.

Yield: 520 mg of oligomeric phenazinium compound 1, consisting of about 30 mol percent 8,8'-bis-(N,N-dimethylamino)-3,3'-dimethyl-10,10'-diphenyl-[2,2']biphenaz-inyl-10,10'-ium-tetrafluoroborate (compound <iv>), about 30 mol percent 3,8',8''-tris-(N,N-dimethylamino)-8-methyl-5,10',10''-triphenyl-[2,2';7',-2'']terphenazine-5,10',10''-ium-tetrafluoroborate (compound <viii>), about 15 mol percent 3'-N,N-dimethylamino-3,8'-dimethyl-8-(N-methylamino)-7'-oxo-10,5'-dipheny-1-5',7'-dihydro-[2,2']biphenazinyl-10-ium-chloride (compound <i>) and about 15 mol percent 3,8'-bis-(N,N-dimethylamino)-8,3'-dimethyl-5,10'-diphenyl-7-hydroxy-[2,2'-]biphenazinyl-5,10'-ium-tetrafluoroborate (compound <vi>).

Preparation Example 2

10 g of 3-amino-7-N,N-dimethylamino-2-methyl-5-phenyl-phenazinium chloride and 2.351 g of copper powder were suspended in 100 ml of 50 percent by weight tetrafluoroboric acid and heated to 50° C. Then, a saturated aqueous sodium nitrite solution (4.164 g in 15 ml of water) was slowly added dropwise followed by stirring over another hour at this temperature. The reaction product was cooled down to room temperature and the reaction mixture introduced in a 50 percent by weight caustic soda lye. The resulting black solid was filtered off and dried.

Yield: 9.8 g of oligomeric phenazinium compound 2, consisting of 30 mol percent 8,8'-bis-(N,N-dimethylamino)-3,3'-dimethyl-10,10'-diphenyl-[2,2]biphenaz-inyl-10,10'-ium-tetrafluoroborate (compound <iv>), 30 mol percent 3,8',8''-trimethyl-8,3',3''-tris-(N-methylamino)-7''-oxo-10,5',5'-'-triphenyl-5',10',5'',7''-tetrahydro-[2,2';7',2'']terphenazine-10-ium-chl-oride (compound <ii>), 15 mol percent 3'-N,N-dimethylamino-3,8'-dimethyl-8-(N-methylamino)-7'-oxo-10,5'-dipheny-1-5',7'-dihydro-[2,2']biphenazinyl-10-ium-chloride (compound <i>) and 15 mol percent 8,8'-bis-(N,N-dimethylamino)-10,10'-diphenyl-3-methyl-[2,2']biphenazinyl-10,10'-ium-tetrafluoroborate (compound <v>).

The first compound <vi> could be isolated from the mixture by gel permeation with a polydextrane column in perchloric acid. The purity of compound <vi> was >90%.

Preparation Example 3

1.5 g of 3-amino-7-N,N-dimethylamino-2-methyl-5-phenyl-phenazinium chloride, 1.5 g of 3-amino-7-N,N-diethylamino-5-phenyl-phenazinium chloride and 590 mg of copper powder were suspended in 100 ml of 50 percent by weight sulfuric acid and heated to 50° C. Then, a saturated aqueous sodium nitrite solution (1.226 g in 10 ml of water) was slowly added dropwise followed by stirring over another hour at this temperature. The reaction product was cooled down to room temperature and the reaction mixture introduced in a 50 percent by weight caustic soda lye. The resulting black solid was filtered off and dried.

Yield: 0.8 g of oligomeric phenazinium compound 3, consisting of 45 mol percent 8'-N,N-diethylamino-8-N,N-dimethylamino-3-methyl-10,10'-diphenyl-[2,2']bi-phenazinyl-10,10'-ium-sulfate (compound <ix>), 15 mol percent 8,3'-bis-(N,N-dimethylamino)-8'-methyl-7'-oxo-10,5'-diphenyl-5',7'-dihydro-[2,2']biphenazinyl-10-ium-hydrogen sulfate (compound <iii>), 15 mol percent 8,3',3"-tris-(N,N-dimethylamino)-7"-oxo-10,5',5"-triphenyl-5',10',5",-7"-tetrahydro-[2,2';7',2"]terphenazine-10-ium-hydrogen sulfate (compound <xi>) and 15 mol percent 3,8'-bis-(N,N-diethylamino)-7-hydroxy-5,10'-diphenyl-[2,2]biphenazinyl-6-,10'-ium-sulfate (compound <xii>).

The thus obtained oligomeric phenazinium compounds of the invention were added, alone or in combination with brighteners or wetting agents, to a copper electrolyte, more specifically to an acid, preferably sulfuric acid, bath.

In order to allow electrolytic deposition of a copper layer onto a workpiece, the latter is contacted with the bath together with an anode. The bath contains copper ions and the mixture of oligomeric phenazinium compounds of the invention. For metal deposition, an electric current is then caused to flow between the workpiece and the anode.

The basic composition of the copper electrolyte may vary within a wide range. Generally, an acidic aqueous copper ions containing solution having the following composition is used:

| copper sulfate ($CuSO_4 \cdot 5H_2O$) | 20-300 g/l |
|---|---|
| preferably | 180-220 g/l |
| sulfuric acid, conc. | 50-350 g/l |
| preferably | 50-90 g/l |
| chloride ions | 0.01-0.25 g/l |
| preferably | 0.05-0.14 g/l |

Instead of copper sulfate, other copper salts may be used as well, at least in parts. Sulfuric acid also can be replaced in part or in whole with fluoroboric acid, methane sulfonic acid or other acids. The chloride ions are added as alkali chloride (e.g., sodium chloride) or in form of analytically pure hydrochloric acid. The addition of sodium chloride may be dispensed with in part or in whole if the additives already contain halide ions.

The oligomeric phenazinium compounds of the present invention are preferably added to the bath in a concentration of 0.00005-0.1 g/l.

The bath may further contain current brighteners, levelers or wetting agents. In order to obtain bright copper deposits exhibiting predetermined physical properties, at least one water soluble sulfur compound and one oxygen containing, high molecular weight compound may be added to the acidic bath of the invention. Further additives such as nitrogen containing sulfur compounds and/or polymeric nitrogen compounds may also be used.

The ready-to-use bath contains these individual components within the following concentration ranges:

| Common oxygen containing, high molecular weight compounds | 0.005-20 g/l |
|---|---|
| preferably | 0.01-5 g/l |
| Common water soluble organic sulfur compounds | 0.0005-0.4 g/l |
| preferably | 0.001-0.15 g/l |

Some utilizable oxygen containing high molecular weight compounds are set forth hereinafter: carboxy methyl cellulose, nonyl phenol-polyglycol ether, octane diol-bis-(polyalkylene glycol ether), octanol polyalkylene glycol ether, oleic acid polyglycol ester, polyethylene glycol-polypropylene glycol (block or copolymerisate), polyethylene glycol, polyethylene glycol-dimethyl ether, polypropylene glycol, polyvinyl alcohol, .beta.-naphthol-polyglycol ether, stearic acid polyglycol ester, stearyl alcohol polyglycol ether.

Some sulfur compounds are set forth hereinafter: sodium salt of 3-(benzthiazolyl-2-thio)-propyl sulfonic acid, sodium salt of 3-mercapto propane-1-sulfonic acid, sodium salt of ethylene dithio dipropyl sulfonic acid, disodium salt of bis-(p-sulfophenyl)-disulfide, disodium salt of bis-(ω-sulfobutyl)-disulfide, disodium salt of bis-(ω-sulfo hydroxy propyl)-disulfide, disodium salt of bis-(ω-sulfo-propyl)-disulfide, disodium salt of bis-(ω-sulfopropyl)-disulfide, disodium salt of methyl-(ω-sulfopropyl)-disulfide, disodium salt of methyl-(ω-sulfopropyl)-tri-sulfide, potassium salt of O-ethyl-dithio carbonic acid-S-(ω-sulfopropyl)-ester, thioglycolic acid, disodium salt of thiophosphoric acid-O-ethyl-bis-(ω-sulfo-propyl)-ester, trisodium salt of thiophosphoric acid-tris-(ω-sulfopropyl)-ester. Corresponding functional groups have been incorporated for water solubility.

Sulfur containing nitrogen compounds, more specifically nitrogen containing thio compounds, preferably thiourea derivatives, and/or polymeric nitrogen compounds e.g., polyamines and polyamides, may be utilized in the following concentrations:

| | 0.0001-0.50 g/l |
|---|---|
| preferably | 0.0005-0.04 g/l |

Preferred nitrogen containing thio compounds are set forth hereinafter: N-acetyl thiourea, N-trifluoroacetyl thiourea, N-ethyl thiourea, N-cyanoacetyl thiourea, N-allyl thiourea, o-tolyl thiourea, N,N'-butylene thiourea, thiazolidine thiol (2), 4-thiazoline thiol(2), imidazolidine thiol(2) (N,N-ethylene thiourea), 4-methyl-2-pyrimidine thiol, 2-thiouracil, sodium salt of saccharine.

Preferred polymeric nitrogen compounds are listed hereinafter: polyethylene imine, polyethylene imide, polyacrylic acid amide, polypropylene imine, polybutylene imine, N-methyl polyethylene imine, N-acetyl polyethylene imine, N-butyl polyethylene imine.

For preparing the bath, the individual components are added to the basic composition. The operating conditions of the bath may more specifically be set as follows:

| | |
|---|---|
| pH value: | <1 |
| temperature: | 15° C.-50° C., preferably 20° C.-40° C. |
| cath. current density | 0.5-12 A/dm$^2$, preferably 3-7 A/dm$^2$ |

The electrolyte may be agitated through a strong fluid flow and possibly by injecting clean air so that the surface of the electrolyte is strongly agitated. This maximizes the mass transfer in the proximity to the electrode and allows for higher current densities. The movement of the cathodes also promotes mass transfer at the respective one of the surfaces. Increased convection and movement of the electrodes permit to achieve constant, diffusion controlled deposition. The movements may be horizontal, vertical and/or caused by vibrations. In combination with air injection, they are particularly efficient.

Copper may be electrochemically replenished by dissolving copper anodes in order to keep the copper content constant. The copper used for the anodes may be copper material containing 0.02 to 0.07 weight percent phosphorus. The copper anodes should be enclosed in a filter bag. The use of inert anodes made of platinized titanium or other coatings is also possible. Present day's prior art lines are lines in which the workpiece is coated in a vertical or horizontal position.

At need, filters for retaining mechanical and/or chemical residues may be inserted into the electrolyte circuits.

The copper electrolyte of the invention is perfectly suited for producing a decorative deposit. It may furthermore be utilized to electrolytically fill blind microvias in printed circuit boards. This constitutes a future oriented technology for manufacturing chip carriers in particular since, in thin circuit traces, increased reliability is achieved over the technique using copper sleeves. In a similar way, the copper electrolyte of the invention provides an elegant solution to produce circuit structures onto semiconductor substrate surfaces (wafers) provided with recesses during the manufacturing of integrated circuits. Using the copper plating method of the invention, an almost constant layer thickness (planarity) is achieved over the entire surface of the wafer, independent of the recesses having a high aspect ratio (1:10), so that such recesses (blind microvias) are filled with copper.

The invention will be understood better upon reading the following Method Examples accompanying the drawings.

Method Example 1

Comparative Test

In an electrolytic cell with soluble, phosphorus containing copper anodes, a copper bath having the following composition was utilized:

200 g/l of copper sulfate (CuSO$_4$.5H$_2$O) [0150] 60 g/l of sulfuric acid conc.

0.12 g/l of sodium chloride

The following brighteners were added:

1.5 g/l of polypropylene glycol (800 Da (dalton)), 0.006 g/l of 3-mercapto-propane-1-sulfonic acid, sodium salt At an electrolyte temperature of 25° C. and at a current density of 4 A/dm$^2$, a uniform, bright, slightly hazy deposit was obtained on a brushed brass sheet.

Method Example 2

Comparative Test 5 mg/l of 7-dimethylamino-3-chlorine-5-phenyl-phenazinium chloride (prepared according to the instructions given in JP 60-056086 A) were further added to the electrolyte according to Method Example 1. After copper had been deposited under the conditions indicated in Method Example 1, the copper layer obtained had a slightly improved appearance. In this case, the brass sheet had a brighter appearance but showed burns (copper powder deposit) at the edges because of the high current density occurring there.

Method Example 3

Comparative Test 5 mg/l of poly-(7-dimethylamino-5-phenyl-phenazinium sulfate) having a mean molar weight of about 8000 Da were further added to the electrolyte according to Method Example 1. The compound was produced analogous to the indications given in DE-AS 20 39 831, column 7, lines 2 and onward. After copper had been deposited under the conditions indicated in Method Example 1, the copper deposit obtained on the brass sheet was of good quality. The deposit displayed uniform brightness with no burns. The brush lines were hardly to be seen any longer. This was indicative of a certain leveling effect of the copper electrolyte.

Method Example 4

4 mg/l of the mixture of the dimeric and trimeric compounds <iii>, <vi>, <xi> and <xii> of the invention with a mean molar weight of about 800 Da (627-913 Da) were further added to the electrolyte according to Method Example 1. After copper had been deposited under the conditions indicated in Method Example 1, the copper layer obtained on the brass sheet had a very good appearance. The deposit showed a high brightness and no burns. The brush lines were totally invisible now. This was indicative of an excellent leveling effect of the copper electrolyte.

Method Example 5

Only 3 mg/l of the mixture of the dimeric and trimeric chlorine compounds <xiii>, <xiv>, <xv>, <xvi> and <xvii> with a mean molar weight of about 800 Da (618-959 Da) were further added to the electrolyte according to Example 1. After copper had been deposited under the conditions indicated in method Example 1, the brass sheet had an extremely good appearance. The deposit was extremely brilliant and mirror-like. The sheet showed no burns. The brush lines were absolutely invisible. This was indicative of an excellent leveling effect of the copper electrolyte although the quantity of mixture had been reduced.

Result of the Examples 1 through 5: it could be shown that the mixture of the chlorine containing monomeric phenazinium compounds only had a low leveling effect. Polymeric phenazinium compounds have a good effect. However, as shown in the Examples 4 and 5, this effect can be appreciably enhanced utilizing the mixture of dimeric and trimeric phenazinium compounds of the invention, the effect being actually appreciably improved by incorporating the chlorine atom in the solution. In this case, it is possible to considerably reduce the concentration while still obtaining an excellent result.

Method Example 6

Comparative Test

To coat a printed circuit board having blind microvias, a copper bath of the following composition was utilized in an electrolytic cell having soluble, phosphorus containing copper anodes:
150 g/l of copper sulfate ($CuSO_4.5H_2O$)
200 g/l of sulfuric acid conc.
0.05 g/l of sodium chloride
The following brighteners were added:
0.5 g/l of polypropylene glycol (820 Da (dalton)),
0.005 g/l of bis-(ω-sulfopropyl)-disulfide, disodium salt
At an electrolyte temperature of 25° C. and at a current density of 1 A/dm², a slightly hazy deposit could be obtained on a previously 8 μm reinforced printed circuit board having small blind holes (blind microvias) after an exposure time of 114 minutes, with a blind hole of a width of 110 μm and a depth of 60 μm being hardly filled with copper. FIG. 1 shows a cross-section of the blind via.

Method Example 7

4 mg/l of the mixture of dimeric and trimeric compounds <iii>, <vi>, <xi> and <xii> with a mean molar weight of about 800 Da (627-913 Da) were further added to the electrolyte according to Example 6. After copper had been deposited under the conditions indicated in Method Example 6, the appearance of the printed circuit board was improved. The blind vias of a width of 110 μm and of a depth of 60 μm were completely and selectively filled with copper. After copper plating had been performed, no recess was visible any longer. The overall quantity of deposited copper was low. FIG. 2 shows a polished cross-section of such a copper plated blind via.

This result is a great improvement over the prior art technique known to be used for electrolytic copper plating of blind vias since these may be filled in a much better way. The reason therefore is the substantially improved leveling effect of the copper plating bath obtained by the mixture of oligomeric phenazinium compounds of the invention. Further, the reliability of the bond between the copper deposited onto the wall of a blind via and the copper layer interrupted by the hole is much better than using the conventional copper plating technique. For, using the mixture in accordance with the invention, no delaminations could be detected between the two metal layers during a thermal solder shock test, whereas there is a risk that the use of known mixtures induces such delaminations under these conditions.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

The invention claimed is:

1. A mixture of oligomeric phenazinium compounds, containing at least two phenazinium compounds selected from the group consisting of:

a) compounds containing two monomeric units having the following chemical formula <I>:

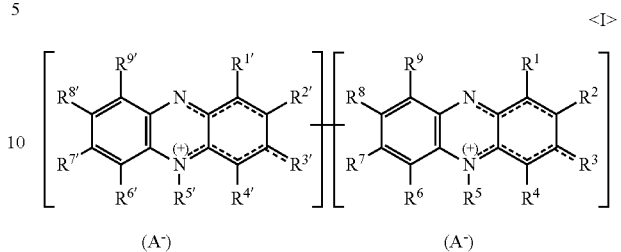

and b) compounds containing three monomeric units having the following chemical formula <II>:

as well as further oligomeric phenazinium compounds, wherein, in the aforementioned chemical formula <I> and <II>, the structure unit $N(R^{5/5'/5''})CC(R^{4/4'/4''})C(R^{3/3'/3''})$ has one of the chemical formula <IIIa> or <IIIb>:

-continued

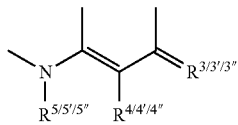
<IIIb> wherein further $R^1$, $R^2$, $R^3$, $R^4$, $R^6$, $R^7$, $R^8$, $R^9$, $R^{1'}$, $R^{2'}$, $R^{3'}$, $R^{4'}$, $R^{6'}$, $R^{7'}$, $R^{8'}$, $R^{9'}$, $R^{1''}$, $R^{2''}$, $R^{3''}$, $R^{4''}$, $R^{6''}$, $R^{7''}$, $R^{8''}$ and $R^{9''}$ have each independently one of the meanings selected from the group consisting of hydrogen, halogen, $NH_2$, amino substituted with lower alkyl, OH, CN, SCN, SH, $C_{1-8}$alkyl and phenyl as well as a single bond that links the individual monomeric units together, $R^5$, $R^{5'}$ and $R^{5''}$ denote each independently H, $C_{1-8}$alkyl or phenyl, and at least one of the residues selected from the group consisting of $R^2$, $R^{2'}$, $R^{2''}$, $R^3$, $R^{3'}$ $R^{3''}$, $R^7$, $R^{7'}$, $R^{7''}$, $R^8$, $R^{8'}$ and $R^{8''}$ has one of the meanings selected from the group consisting of halogen and hydroxy, wherein further $A^-$ is an acid anion and wherein further all of the oligomeric phenazinium compounds having the chemical formula <I> and <II> are contained in the mixture in an amount of at least 80 mol-%.

2. The mixture of oligomeric phenazinium compounds according to claim 1, wherein at least one of the residues selected from the group consisting of $R^2$, $R^{2'}$, $R^{2''}$, $R^3$, $R^{3'}$ $R^{3''}$, $R^7$, $R^{7'}$, $R^{7''}$, $R^8$, $R^{8'}$ and $R^{8''}$ in the oligomeric phenazinium compounds according to the chemical formula <II> has one of the meanings selected from the group consisting of halogen and hydroxy.

3. The mixture of oligomeric phenazinium compounds according to claim 1, wherein at least one of the residues selected from the group consisting of $R^2$, $R^{2'}$, $R^{2''}$, $R^8$, $R^{8'}$ and $R^{8''}$ represents lower alkyl.

4. The mixture of oligomeric phenazinium compounds according to claim 3, wherein lower alkyl is methyl or ethyl.

5. The mixture of oligomeric phenazinium compounds according to claim 1, wherein at least one of the residues selected from the group consisting of $R^3$, $R^{3'}$ $R^{3''}$, $R^7$, $R^{7'}$, and $R^{7''}$ represents a lower alkylated amine.

6. The mixture of oligomeric phenazinium compounds according to claim 5, wherein the lower alkylated amine is selected from the group consisting of N-methylamine, N-ethylamine, N,N-dimethylamine and N,N-diethylamine.

7. The mixture of oligomeric phenazinium compounds according to claim 1, wherein at least one of the residues selected from the group consisting of $R^5$, $R^{5'}$ and $R^{5''}$ represents methyl or phenyl.

8. The mixture of oligomeric phenazinium compounds according to claim 1, wherein the acid anion $A^-$ is selected from the group consisting of sulfate, hydrogen sulfate, halide, tetrafluoroborate, hexafluorophosphate, nitrate, acetate, trifluoroacetate and methanesulfonate.

9. The mixture of oligomeric phenazinium compounds according to claim 1, wherein the monomeric units in the compounds are selected from the group consisting of:
- 7-N,N-dimethylamino-3-hydroxy-2-methyl-5-phenyl-phenazinium,
- 3-chloro-7-N,N-dimethylamino-5-phenyl-phenazinium,
- 8-dimethylamino-10-phenyl-10H-phenazine-2-one,
- 3-N-ethylamino-7-hydroxy-5-phenyl-phenazinium,
- 3-chloro-7-N-ethylamino-5-phenyl-phenazinium,
- 3-methyl-8-N-methylamino-10-phenyl-10H-phenazine-2-one.

10. The mixture of oligomeric phenazinium compounds according to claim 1, wherein the compounds have chemical formulae selected from the group consisting of:

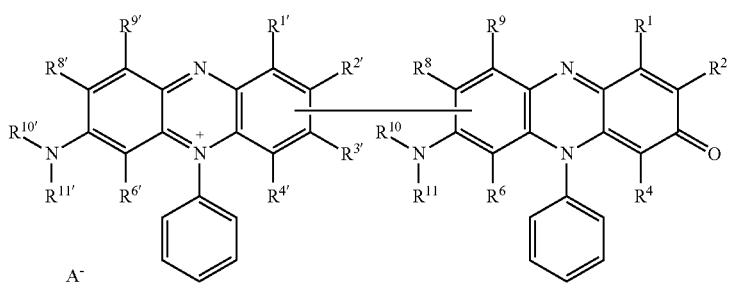
<V>

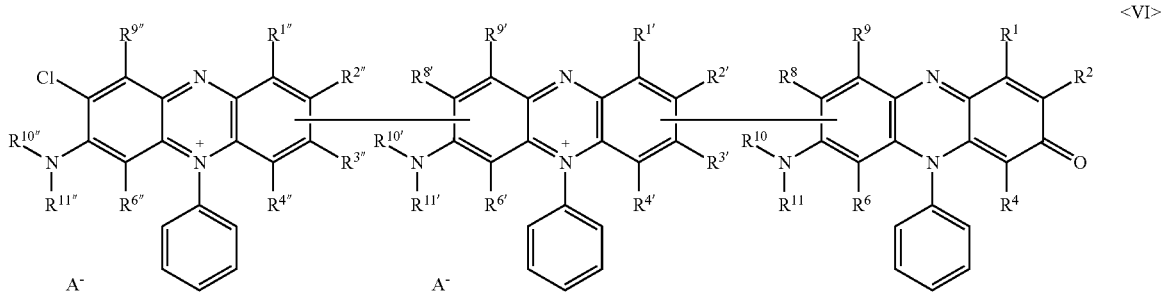
<VI>

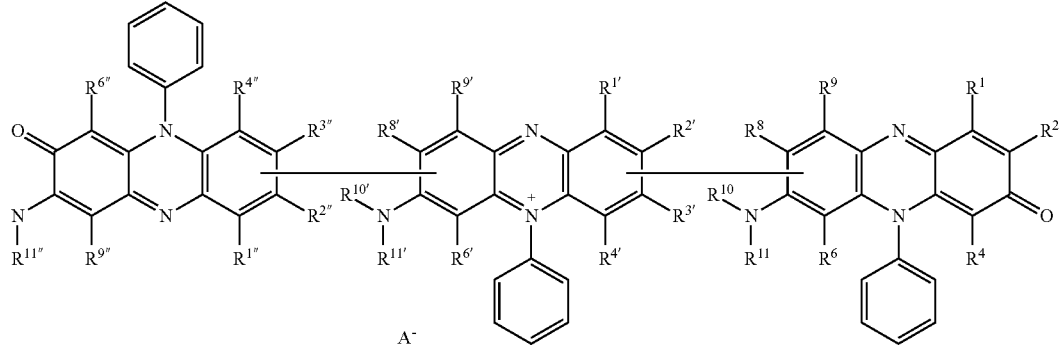

<VII>

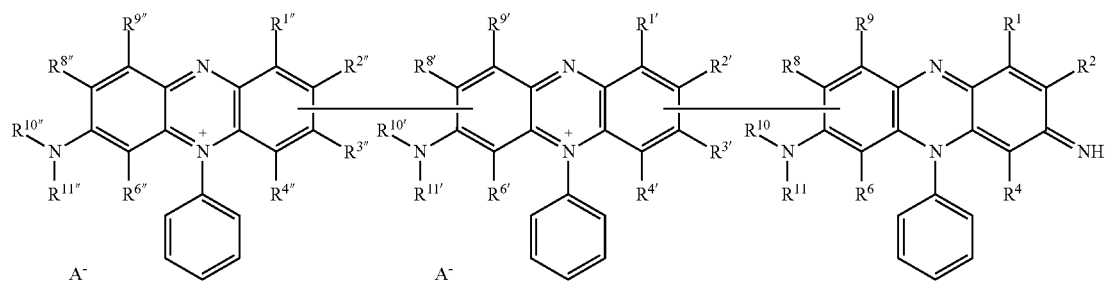

<VIII> wherein $R^1$, $R^2$, $R^4$, $R^6$, $R^8$, $R^9$, $R^{1'}$, $R^{2'}$, $R^{3'}$, $R^{4'}$, $R^{6'}$, $R^{8'}$, $R^{9'}$, $R^{1''}$, $R^{2''}$, $R^{3''}$, $R^{4''}$, $R^{6''}$, $R^{8''}$ and $R^{9''}$ have the above mentioned meanings and wherein $R^{10}$, $R^{11}$, $R^{11'}$, $R^{10'}$ and $R^{11''}$ represent hydrogen or lower alkyl.

11. The mixture of oligomeric phenazinium compounds according to claim 1, selected from the group consisting of:
3'-N,N-dimethylamino-3,8'-dimethyl-8-(N-methylamino)-7'-oxo-10,5'-diphenyl-5',7'-dihydro-[2,2']biphenazinyl-10-ium chloride;
3,8',8''-trimethyl-8,3',3''-tris-(N-methylamino)-7''-oxo-10,5', 5''-triphenyl-5', 10', 5'',7''-tetrahydro-[2,2';7',2''] terphenazine-10-ium chloride;
8,3'-bis-(N,N-dimethylamino)-8'-methyl-7'-oxo-10,5'-diphenyl-5',7'-dihydro-[2,2]biphenazinyl-10-ium hydrogen sulfate; 3,8'-bis-(N,N-dimethylamino)-8,3'-dimethyl-5,10'-diphenyl-7-hydroxy-[2,2]biphenazinyl-5,10'-ium tetrafluoroborate;
3,8'-bis-(N,N-dimethylamino)-8,3'-dimethyl-5,10'-diphenyl-7-hydroxy-[2,2']biphenazinyl-5,10'-ium chloride;
8'-N,N-diethylamino-3-N,N-dimethylamino-7-hydroxy-8-methyl-5,10'-diphenyl-[2,2']biphenazinyl-6,10'-ium sulfate;
8,3',3''-tris-(N,N-dimethylamino)-7''-oxo-10,5',5''-triphenyl-5',10',5'',7''-tetrahydro-[2,2';7',2'']terphenazine-10-ium hydrogen sulfate;
3,8'-bis-(N,N-diethylamino)-7-hydroxy-5,10'-diphenyl-[2,2']biphenazinyl-6,10'-ium sulfate;
7-chloro-3,8'-bis-(N,N-dimethylamino)-5,10'-diphenyl-8-methyl-[2,2]biphenazinyl-5,10'-ium chloride;
7-chloro-3,8'-bis-(N,N-dimethylamino)-8,3'-dimethyl-5,10'-diphenyl-[2,2']biphenazinyl-5,10'-ium chloride;
7-chloro-3,8'-bis-(N,N-dimethylamino)-5,10'-diphenyl-[2,2']biphenazinyl-5,10'-ium chloride;
7-chloro-3,8',8''-tris-(N,N-dimethylamino)-8,3'-dimethyl-5,10',10''-triphenyl-[2,2';7',2'']terphenazinyl-5,10',10''-ium chloride;
7-chloro-8,1'-dimethyl-8'-N,N-dimethylamino-5,10'-diphenyl-[2,2']biphenazinyl-5,10'-ium chloride;
8,3',3''-tris-(N,N-dimethylamino)-7''-oxo-10,5',5''-triphenyl-5'',7''-dihydro-[2,2';7',2'']terphenazine-10,5'-ium hydrogen sulfate;
8,8'-bis-(N-methylamino)-3-chloro-10,10'-diphenyl-[2,2']biphenazinyl-10,10'-ium chloride; and
3,3',3''-tris-(N-methylamino)-8''-chloro-5,5',5''-triphenyl-[8,2';8,7'']terphenazine-5,5',5''-ium chloride.

12. The mixture of oligomeric phenazinium compounds according to claim 1, wherein at least one of the residues selected from the group consisting of $R^2$, $R^3$, $R^7$ and $R^8$ in the oligomeric phenazinium compounds according to the chemical formula <II> has one of the meanings selected from the group consisting of halogen and hydroxy.

* * * * *